US008971145B2

(12) United States Patent
Pelley

(10) Patent No.: US 8,971,145 B2
(45) Date of Patent: Mar. 3, 2015

(54) SYNCHRONOUS MULTIPLE PORT MEMORY WITH ASYNCHRONOUS PORTS

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 13/780,101

(22) Filed: Feb. 28, 2013

(65) Prior Publication Data

US 2014/0241100 A1 Aug. 28, 2014

(51) Int. Cl.
*G11C 8/16* (2006.01)

(52) U.S. Cl.
CPC .................................... *G11C 8/16* (2013.01)
USPC .................................. 365/230.05; 365/233.5

(58) Field of Classification Search
CPC ...................................... G11C 8/16; G11C 8/18
USPC ........................................... 365/230.05, 233.5
See application file for complete search history.

(56) References Cited

U.S. PATENT DOCUMENTS

| 5,781,480 | A | 7/1998 | Nogle et al. |
| 6,078,527 | A | 6/2000 | Roth et al. |
| 6,181,634 | B1 | 1/2001 | Okita |
| 6,473,357 | B1 | 10/2002 | Fan et al. |
| 6,487,207 | B1 * | 11/2002 | Thomann ................. 370/395.71 |
| 6,625,699 | B2 | 9/2003 | Cohen et al. |
| 6,816,955 | B1 | 11/2004 | Raza et al. |
| 6,845,059 | B1 | 1/2005 | Wordeman et al. |
| 6,873,565 | B1 | 3/2005 | Riedlinger et al. |
| 7,054,217 | B2 | 5/2006 | Yamada |
| 7,184,359 | B1 | 2/2007 | Bridgewater et al. |
| 7,206,251 | B1 | 4/2007 | Yu |
| 7,397,788 | B2 * | 7/2008 | Mies et al. ..................... 370/351 |
| 7,533,222 | B2 | 5/2009 | Leung |
| 7,564,738 | B2 | 7/2009 | Pelley et al. |
| 7,573,753 | B2 | 8/2009 | Atwood et al. |
| 7,808,847 | B2 | 10/2010 | Wang et al. |
| 7,856,026 | B1 * | 12/2010 | Finan et al. ................... 370/412 |
| 7,894,296 | B2 | 2/2011 | Lee et al. |
| 7,940,599 | B2 | 5/2011 | Lu et al. |
| 8,438,306 | B2 * | 5/2013 | De Lescure et al. .......... 709/238 |

OTHER PUBLICATIONS

Heshami, M. et al., "A 250-MHz Skewed-Clock Pipelined Dual-Port Embedded DRAM", Proceedings of the IEEE Custom Integrated Circuits Conference, May 1-4, 1995, pp. 143-146.
Johguchi, K. et al., "A 0.6-Tbps, 16-Port SRAM Design with 2-Stage Pipeline and Multi-Stage-Sensing Scheme", 33rd European Solid State Circuits Conference, 2007, pp. 320-323.

(Continued)

*Primary Examiner* — Michael Tran

(57) ABSTRACT

A memory system includes a multi-port memory having a first port and a second port. First registers and second registers provide first and second addresses, respectively, to the first and second ports. An access controller controls the multi-port memory to launch an access for the valid address provided by the first input registers in response to the first edge of the master clock unless an immediately preceding first edge of the master clock has occurred more recently than the most recent occurrence of the first edge of the first clock and to launch an access for the valid address provided by the second input registers in response to the first edge of the master clock unless an immediately preceding first edge of the master clock has occurred more recently than the most recent occurrence of the first edge of the second clock.

21 Claims, 6 Drawing Sheets

(56) References Cited

OTHER PUBLICATIONS

Chang, M. et al., "Wide VDD Embedded Asynchronous SRAM With Dual-Mode Self-Timed Technique for Dynamic Voltage Systems", IEEE Transactions on Circuits and Systems I: Regular Papers, vol. 56, No. 8, Aug. 2009, pp. 1657-1667.

Endo, K. et al., "Pipelined, Time-Sharing Access Technique for an Integrated Multiport Memory", IEEE Journal of Solid-State Circuits, vol. 26, No. 4, Apr. 1991, pp. 549-554.

Ishii, Y. et al., "A 28-nm dual-port SRAM macro with active bitline equalizing circuitry against write disturb issue", 2010 IEEE Symposium on VLSI Circuits, Jun. 16-18, 2010, pp. 99-100.

Johnston, C.T., et al., "FPGA implementation of a Single Pass Connected Components Algorithm", 4th IEEE International Symposium on Electronic Design, Test & Applications, May 2008, pp. 228-231.

Lee, H., "Design of Ultra Low Power Pseudo-Asynchronous SRAM", Twelfth Annual IEEE International ASIC/SOC Conference, Sep. 15-18, 1999, p. 275.

Muttersbach, J. et al., "Globally-Asynchronous Locally-Synchronous Architectures to Simplify the Design of On-Chip Systems", Twelfth Annual IEEE International ASIC/SOC Conference, 1999, pp. 317-321.

Nakase, Y. et al., "A 300MHz Dual Port Graphics RAM using Port Swap Architecture", ISSCC97/Session 24/Non-Volatile Memory and SRAM/Paper SP 24.3, IEEE International Solid State Circuits Conference, Feb. 8, 1997, pp. 400-401.

Nii, K. et al., "Synchronous Ultra-High-Density 2RW Dual-Port 8T-SRAM with Circumvention of Simultaneous Common-Row-Access", IEEE Journal of Solid-State Circuits, vol. 44, No. 3, Mar. 2009, pp. 977-986.

Pilo, H. et al., "A 5.6ns Random Cycle 144Mb DRAM with 1.4b/s/pin and DDR3-SRAM Interface", ISSCC 2003/Session 17/SRAM and DRAM/Paper 17.5, IEEE International Solid-State Circuits Conference, Feb. 12, 2003, 11 pgs.

Soon-Hwei, T. et al., "A 160-Mhz 45-mW Asynchronous Dual-Port 1-Mb CMOS SRAM", 2005 IEEE Conference on Electron Devices and Solid-State Circuits, Dec. 19-21, 2005, pp. 351-354.

U.S. Appl. No. 13/740,862, Pelley, P.H., "Multiport Memory With Matching Address and Data Line Control", filed Jan. 14, 2013.

U.S. Appl. No. 13/740,868, Pelley, P.H., "Multiport Memory With Matching Address Control", filed Jan. 14, 2013.

U.S. Appl. No. 13/483,764, Pelley, P.H., et al., "Multi-Port Register File with Multiplexed Data", filed May 30, 2012.

U.S. Appl. No. 13/873,988, Pelley, P.H., et al., "Synchronous Multiple Port Memory With Asynchronous Ports", filed Apr. 30, 2013.

\* cited by examiner

SYNCHRONOUS MULTIPLE PORT MEMORY WITH ASYNCHRONOUS PORTS

BACKGROUND

1. Field

This disclosure relates generally to synchronization, and more specifically, to a synchronous multiple port memory with asynchronous ports.

2. Related Art

Along with recent advancements of semiconductor technologies, smaller-size and larger-capacity memories that allow high-speed reading/writing operations have been developed. Further, a so-called multiport memory including plural input ports and output ports has been used for reading/writing data of different addresses.

Multi-port memories, by providing access to the storage element of memory cells to more than one resource, such as in the case of multi-core processor or an interface between a processor and a bus, have become more commonly used. One of the issues with multi-port memories is how to coordinate this aspect of providing access to more than one resource. Often this ability is achieved using wait states and/or arbitration. This can result in unpredictable access times which is undesirable.

Accordingly there is a need for a multi-port memory that improves upon one or more of the issues discussed above. Furthermore, in some scenarios, it is necessary for a synchronous memory to interface to other logic units having different operating frequencies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, when a bit cell is selected by two ports, a bit line pair of one port is kept decoupled from the storage nodes of the selected memory cell and from its data line pair whereas the bit line pair of the other port is coupled to the storage nodes of the selected memory cell and to its data line pair and to the data line pair of the one port. Also the selected word line of the one port is kept disabled whereas the selected word line of the other port is enabled. Thus, the capacitance of the bit line pair of the one port is kept from adversely impacting the access to the selected bit cell whereas the bit line pair of the other port provides the needed access. Bit cell stability issues associated with simultaneous multiport access to a common bit cell are thus avoided. The bit line pair of the one port is coupled to the data line pair of the one port by column decoding. This is better understood by reference to the drawings and the following description.

Figure 1:
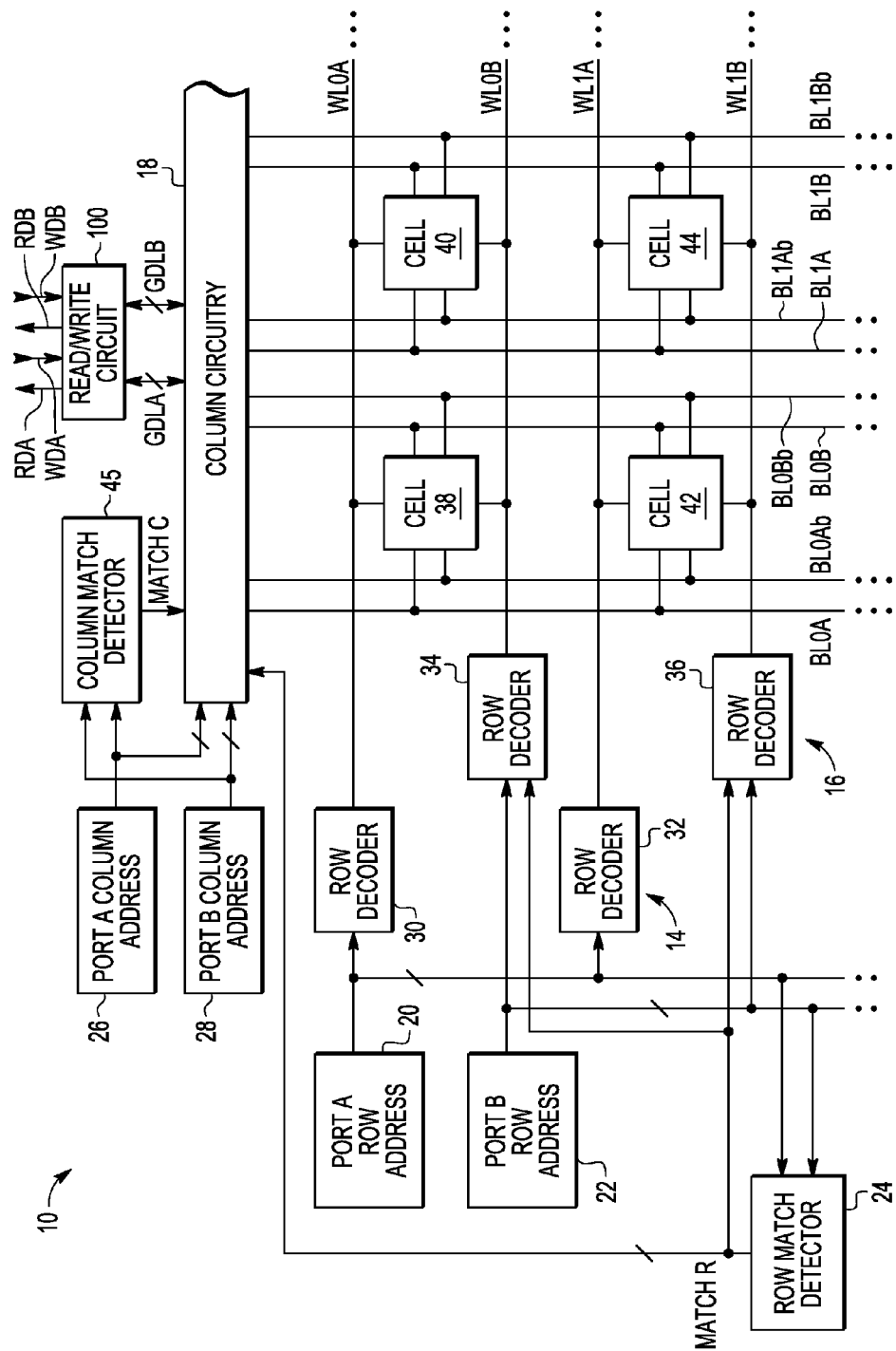
FIG. 1 is a block diagram of a first portion of a multi-port memory according to an embodiment.

Shown in FIG. 1 is a memory 10 having an array 12, a port A row decoder 14, a port B row decoder 16, column circuitry 18, port A row address buffer 20, a port B row address buffer 22, a row match detector 24, a port A column address buffer 26, a port B column address buffer 28, a column match detector 45, and a read/write circuit 100. Port A row decoder 14 comprises a row decoder 30 and a row decoder 32. Port B row decoder 22 comprises a row decoder 34 and a row decoder 36. Array 12 comprises bit cells 38, 40, 42, and 44.

Figure 4:
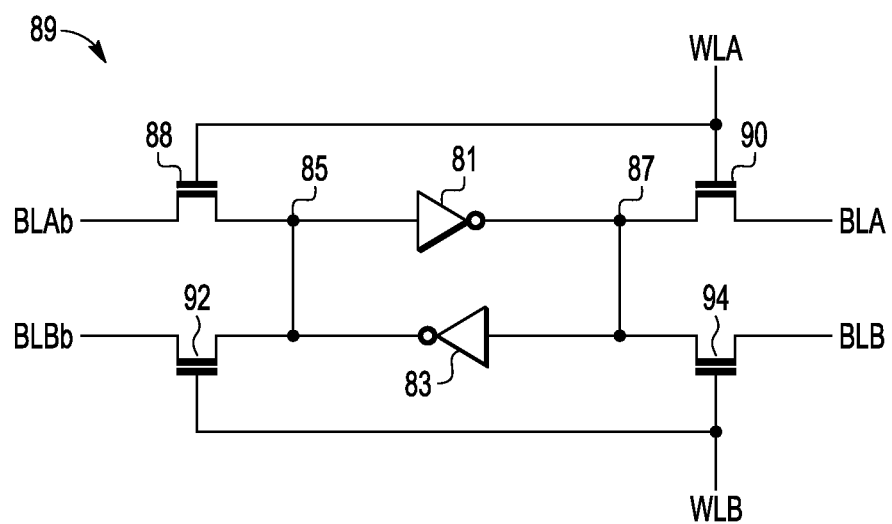
FIG. 4 is a circuit diagram of a memory cell of the first portion of the multi-port memory of FIG. 1.

Shown in FIG. 4 is a circuit diagram of an exemplary memory cell 89 which is exemplary for the other bit cells of array 12 such as memory cells 38, 40, 42, and 44. Bit cell 38, which is a static random access memory (SRAM) cell, comprises inverters 81 and 83 connected to nodes 85 and 87 and transistors 88, 90, 92, and 94 which are N channel transistors in this example. Inverter 81 has an input connected to node 85 and an output connected to node 87. Inverter 83 has an input connected to node 87 and an output connected node 85. Nodes 85 and 87 are storage nodes of memory cell 38. Transistor 88 has a first current electrode connected to node 85, a control electrode connected to word line WLA which is a port A word line, and a second current electrode connected to bit line BLAb which is a complementary bit line of port A. Transistor 90 has a first current electrode connected to node 87, a control electrode connected to word line WLA, and a second current electrode connected to bit line BLA which is a true bit line of port A. Transistor 92 has a first current electrode connected to node 85, a control electrode connected to a word line WLB, which is a word line of port B, and a second current electrode connected to complementary bit line BLBb of port B. Transistor 94 has a first current electrode connected to node 87, a control electrode connected to word line WLB, and true bit line BLB of port B. Nodes 85 and 87 are storage nodes that are accessed through transistors 88 and 92 for node 85 and transistors 90 and 94 for node 87. Inverters 81 and 83 together may be considered a storage latch. Transistors 90 and 88 are enabled when memory cell 89 is selected by port A and for coupling the storage nodes to the port A bit line pair. Transistors 92 and 94 are enabled when memory cell 89 is selected by port B. If memory cell 89 is selected by both port A and port B, transistors 88 and 90 are enabled and transistors 92 and 94 are kept disabled by deselecting word line WLB so that bit lines BLBb and BLB are kept isolated from storage nodes 85 and 87. In this example the bit lines are used for either writing to storage nodes 85 and 87 or reading from storage nodes 85 and 87. The word lines are for enabling the coupling between storage nodes and bit lines. The control electrodes of transistors 88, 90, 92, and 94 may be considered enable inputs and the second current electrodes may be considered access nodes.

Array 12 includes more than the four bit cells, which may be called memory cells, shown as memory cells 38, 40, 42, and 44 in FIG. 1 and accordingly more bit line pairs and word lines than shown. Memory cells 38 and 40 have a first enable input connected to word line WL0A and a second enable input connected to word line WL0B. The access nodes for port A of memory cell 38 are connected to true and complementary bit lines BL0A and BL0Ab, and the access nodes for port B are connected to true and complementary bit lines BL0B and BL0Bb. The access nodes for port A of memory cell 40 are connected to true and complementary bit lines BL1A and BL1Ab, and the access nodes for port B are connected to true and complementary bit lines BL1B and BL1Bb.

Memory cells 42 and 44 have a first enable input connected to word line WL1A and a second enable input connected to word line WL1B. The access nodes for port A of memory cell 42 are connected to true and complementary bit lines BL0A and BL0Ab and the access nodes for port B are connected to true and complementary bit lines BL0B and BL0Bb. The access nodes for port A of memory cell 44 are connected to true and complementary bit lines BL1A and BL1Ab, and the access nodes for port B are connected to true and complementary bit lines BL1B and BL1Bb. Port A row address buffer 20 provides true and complementary signals of row address signals for port A. Port B row address buffer 22 provides true and complementary signals of row address signals for port B. Row decoders 30 and 32 are coupled to the combination of true and complementary address signals for port A. When row decoders 30 and 32 output a logic high, they select word line WL0A and WL1A, respectively. Row decoders 34 and 36 are coupled to the combination of true and complementary address signals for port B. When row decoders 34 and 36 are a logic high, they select word line WL0B and WL1B, respectively. Row match detector 24 is coupled to address buffers 20 and 22 and detects when they provide the same address and provides a true and a complement signals of a row match indicator MATCH R which is coupled to row decoders 34 and 36 that are associated with port B. When row addresses for port A and port B are the same, that means that the selected word lines for port A and port B would be the same row. When the row addresses match the MATCH R signal inhibits row decoders 34 and 36 resulting in word lines WL0B and WL1B being inactive. Consequently, only port A bit line pairs (BL0A, BL0Ab or, BL1A, BL1Ab) may be selected by the memory cells on WL0A or alternatively the memory cells on WL1A. In contrast, in normal operation with no row address match, one of word lines WL0A, WL1A and one of word lines WL0B, WL1B are both selected. As a result the bit lines in both ports coupled to the selected word lines of the corresponding port are activated by the memory cells coupled to the active word lines. That is, in normal operation both ports are active in array 12 so that a word line and bit lines are activated for both ports. Column circuitry 18 is coupled to bit lines BL0A, BL0Ab, BL0B, BL0Bb, BL1A, BL1Ab, BL1B, and BL1Bb, selects among these bit lines, senses data at the selected bit lines, and couples the sensed data to global data lines GDLA for port A and GDLB for port B in response to column addresses provided by port A column address buffer 26 and port B column address buffer 28. True and complementary bit lines of the same port connected to the same column of cells may be referenced as a bit line pair. For example, bit lines BL0A and BL0Ab form a bit line pair. Similarly, data lines DLA and DLAb shown in FIG. 2 may be referenced as a data line pair.

Figure 2:
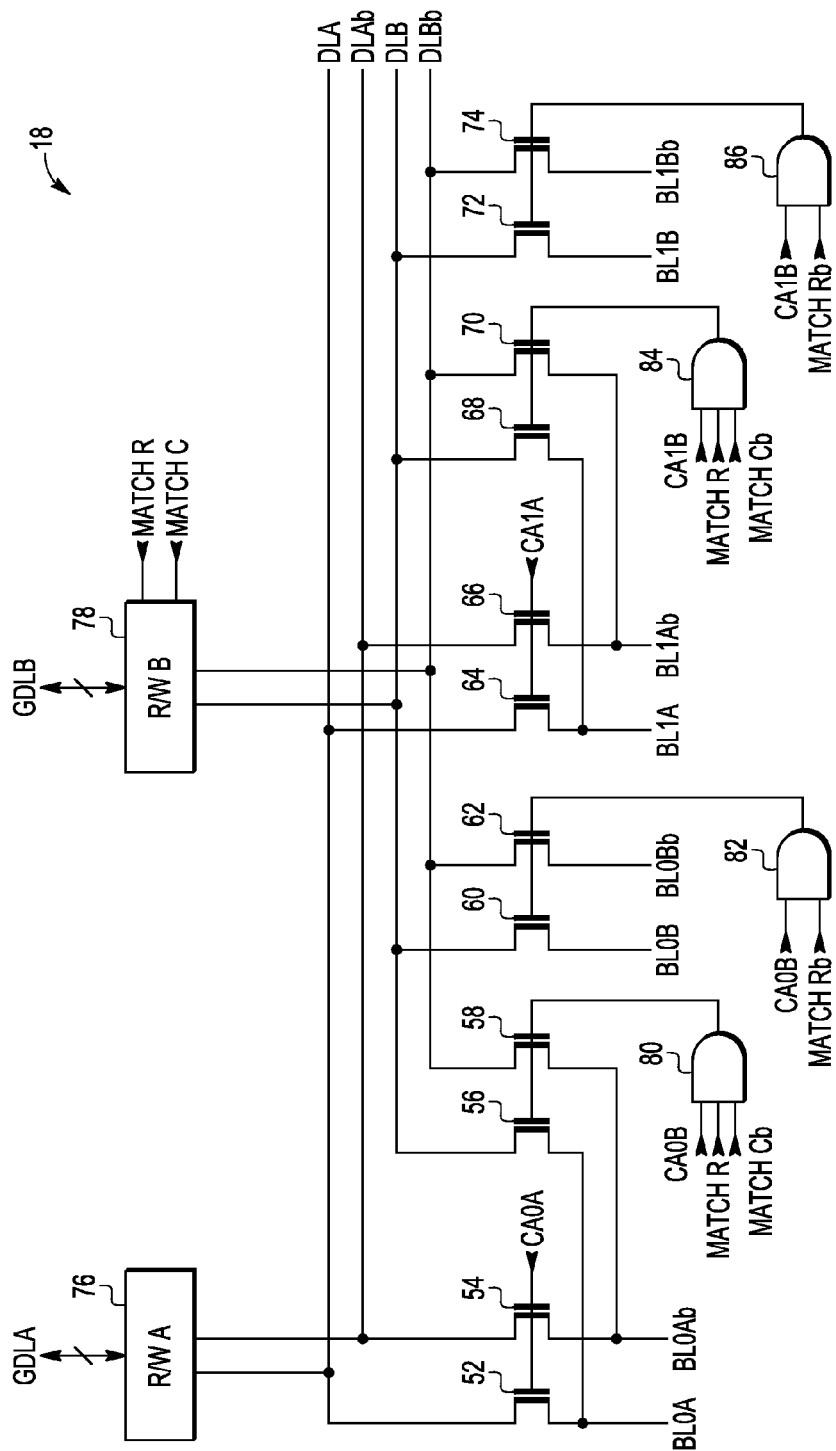
FIG. 2 is a combination circuit, logic, and block diagram of a portion of the first portion of the multi-port memory of FIG. 1.

Shown in FIG. 2 is column circuitry 18 in more detail. Column circuitry 18 comprises transistors 52, 54, 56, 58, 60, 62, 64, 66, 68, 70, 72, and 74, a read/write (R/W) A buffer 76 for port A, a R/W B buffer 78 for port B, AND gates 80, 82, 84, and 86. Column circuitry 18 less the R/W A buffer 76 and R/W B buffer 78 may be referenced as switching logic. Signals CA0A, CA0B, CA1A, and CA1B result from decoding the port A column address for signals CA0A and CA1A and result from decoding the port B column address for signals CA0B and CA1B and may referenced as a column address signal or a column decode signal. Transistor 52 has a first current electrode connected to bit line BL0A, a control electrode for receiving a column address signal CA0A for port A, and a second current electrode coupled to a true data line DLA for port A that is coupled to R/W A buffer 76. Transistor 54 has a first current electrode connected to bit line BL0Ab, a control electrode for receiving column address signal CA0A, and a second current electrode connected to a complementary data line DLAb that is coupled to R/W A buffer 76. Transistor 60 has a first current electrode connected to bit line BL0B, a control electrode connected to an output of AND gate 80, and a second current electrode coupled to a true data line DLB for port B that is coupled to R/W B buffer 78 for port B. Transistor 62 has a first current electrode connected to bit line BL0Bb, a control electrode connected to the output of AND gate 82, and a second current electrode coupled to a complementary data line DLBb for port B that is connected to R/W B buffer 78 for port B. Transistor 60 has a first current electrode coupled to BL0B, a control electrode coupled to output of NAND gate 82 and a second control electrode coupled to data line DLB. Thus when there is not a row match and the column address CA0b is asserted, transistors 60 and 62 become conductive so that bit lines BL0B and BL0Bb are coupled to data lines DLB and DLBb, respectively, through transistors 60 and 62, respectively. Transistor 64 has a first current electrode connected to bit line BL1A, a control electrode for receiving a column address CA1A for port A, and a second current electrode coupled to true data line DLA for port A that is coupled to R/W A buffer 76. Transistor 66 has a first current electrode connected to bit line BL1Ab, a control electrode for receiving column address CA1A, and a second current electrode connected to complementary data line DLAb that is coupled to R/W A buffer 76. Transistor 72 has a first current electrode connected to bit line BL1B, a control electrode connected to an output of AND gate 86, and a second current electrode coupled to true data line DLB for port B that is connected to R/W B buffer 78 for port B. Transistor 74 has a first electrode coupled to BL1Bb, a control gate coupled to the output of NAND gate 86, and a second current electrode coupled to data line DLBb. AND gate 86 has a first input for receiving a column address CA1B for port B and a second input for receiving complementary row match indicator match Rb that is provided by row match detector 24 when it detects that the port A and the port B row addresses are different. As previously described for complementary row match indicator match Rb, when a match has not been detected, complementary row match indicator match Rb is a logic high so that column address signal CA1B for port B is passed to the control gate of transistors 72 and 74. Thus, when column address CA1B is asserted transistors 72 and 74 become conductive so that bit lines VL1B and BL1Bb are coupled to data lines DLB and DLBb, respectively, through transistors 72 and 74, respectively.

Transistor 56 has a first current electrode connected to bit line BL0A which is for port A, a control electrode connected to the output of AND gate 80, and a second current electrode coupled to data line DLB which is for port B that is connected to R/W B buffer 78 for port B. Transistor 58 has a first current electrode connected to complementary bit line BL0Ab which is for port A, a control electrode connected to the output of AND gate 80, and a second current electrode coupled to complementary data line DLBb which is for port B that is connected to R/W B buffer 78 for port B. AND gate 80 has a first input for receiving column address signal CA0B which is for port B, row match indicator match R, and complementary column match indicator MATCH Cb. When the column addresses for ports A and B match complementary column match indicator MATCH Cb is a logic low thus when there is a column address match, AND gate 80 is forced to provide a logic low output which causes transistors 56 and 58 to be non-conductive. When the row addresses for ports A and B do not match, row match indictor MATCH R is a logic low which also forces AND gate 80 to provide a logic low. Thus, when the row addresses do not match, the output of AND gate 80 is a logic low and transistors 56 and 58 are non-conductive. On the other hand when there is no column match but there is a row match, MATCH R and MATCH Cb are both a logic high and MATCH CB are both a logic high so that the output of AND gate 80 follows column address signal CA0B. Thus for the case where there is a row match but not a column match the access for port B is with the port A bit line pair as selected by the port B column address. In such case Transistors 56 and 58 are conductive and couple the pair of port A bit lines BL0A and BL0Ab to port B data lines DLB and DLBb so that the port B R/WB circuit may write to or read from the port A bit line pair.

Transistor 68 has a first current electrode connected to bit line BL1A which is for port A, a control electrode connected to the output of AND gate 84, and a second current electrode coupled to data line DLB which is for port B that is connected to R/W B buffer 78 for port B. Transistor 70 has a first current electrode connected to complementary bit line BL1Ab which is for port A, a control electrode connected to the output of AND gate 84, and a second current electrode coupled to complementary data line DLBb which is for port B that is connected to R/W B buffer 78 for port B. AND gate 84 has a first input for receiving column address signal CA1B which is for port B, row match indicator match R, and complementary column match indicator MATCH Cb. Similarly as for AND gate 80, when the column addresses for ports A and B match complementary column match indicator MATCH Cb is a logic low thus when there is a column address match, AND gate 84 is forced to provide a logic low output which causes transistors 68 and 70 to be non-conductive. When the row addresses for ports A and B do not match, row match indictor MATCH R is a logic low which also forces AND gate 84 to provide a logic low. Thus, when the row addresses do not match, the output of AND gate 80 is a logic low and transistors 68 and 70 are non-conductive. On the other hand when there is no column match but there is a row match, MATCH R and MATCH Cb are both a logic high so that the output of AND gate 80 follows column address signal CA0B. Thus for the case where there is a row match but not a column match and the access for port B is through the port A bit line as selected by the port B column address. When there is row match but not a column match, the Port B data line pair DLB, DLB0 is coupled to a different bit line pair than the bit line pair accessed by port A and coupled to the data line pair DLA, DLAb. Consequently each addressed bit line pair of port A is coupled to only one data line pair, either DLA, DLAb or DLB, DLBb. As stated before all of the bit lines of port B are disconnected under row address match conditions.

Figure 3:
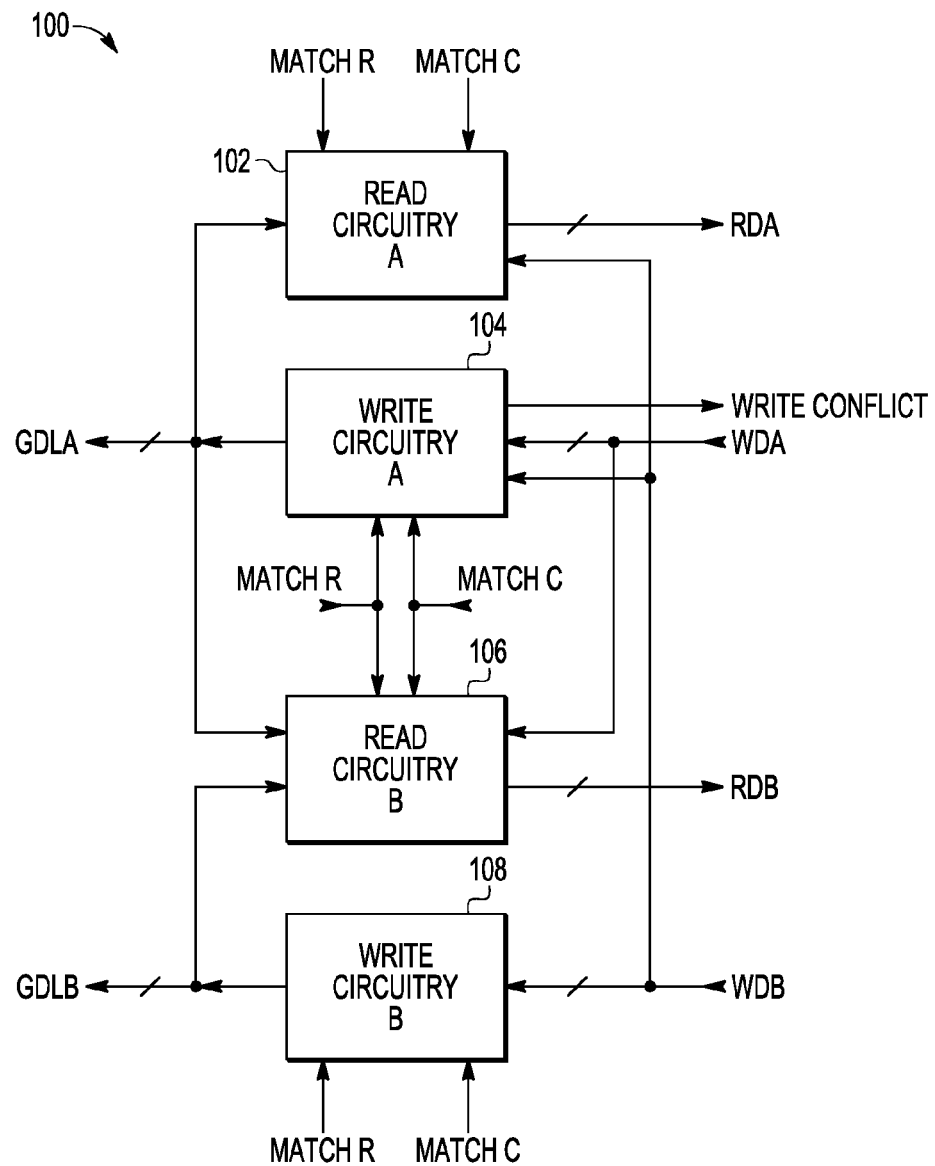
FIG. 3 is a block diagram of a second portion of the multi-port memory of FIG. 1 according to the embodiment.

Shown in FIG. 3 is read/write circuit 100 coupled to global data lines GDLA and GDLB for ports A and B, respectively, comprising read circuitry 102 for port A, write circuitry 104 for port A, read circuitry 106 for port B, and write circuitry 108 for port B. Read circuitry 102 has an input coupled to global data lines GDLA and a read output RDA for outputting data that has been read for port A. Write circuitry 104 has an output coupled to global data lines GDLA and a write input WDA for receiving data that is to be written for port A. Read circuitry 106 has an input coupled to global data lines GDLB and read output RDB for outputting data that has been read for port B. Write circuitry 108 has an output coupled to global data lines GDLB and a write input WDB for receiving data that is to be written for port A. Read circuitry 102 further has an input coupled to write input WDB, an input for receiving match R, and an input for receiving match C. Write circuitry 104 further has an input coupled to write input WDB, an input for receiving match R, and an input for receiving match C.

Read circuitry 106 further has an input coupled to write input WDA, an input for receiving match R, and an input for receiving match C.

For a read in the case where the row addresses for ports A and B are different, data present on the bit lines is selectively coupled to data line pair DLA and DLAb and data line pair DLB and DLBb from port A bit lines and port B bit lines, respectively. The selection is made by column address signals CA0A and CA1A for port A and column address signals Ca0B and CA1B for port B. The row decoder selected by the port A row address enables its word line, and the row decoder selected by the port B address enables its word line. MATCH R is not asserted because the row addresses for ports A and B are different so none the row decoders are disabled due to match R. As stated previously, more memory cells than those shown are present and similarly there are more bit line pairs and word lines and thus the corresponding selection signals for column selection and row selection. The description is focused on the selection and non-selection relating to the shown signals such as Ca0A, Ca1A, Ca0B, and Ca1B for column selection and WL0A, WL1A, WL0B, and WL1B for row selection. R/W A buffer 76 and R/W B buffer 78 each include a sensing circuit and a write driver. For a read, R/W A buffer 76 and R/W B buffer 78 sense the data present on data line pair DLA and DLBb and data line pair DLB and DLBb, respectively. After sensing, the data is provided on global data lines GDLA and GDLB. For writing, data is received on global data lines GDLA and GDLB. The data is then written by R/W A buffer 76 and R/W B buffer 78 onto data line pair DLA and DLAb and data line pair DLB and DLBb, respectively. The bit lines are selected for a write in the same manner as for a read. In this example, the selection is a one of two selection. The bit line pair associated with a column address is the bit line pair selected for normal operation in which the row addresses for port A and B are different. For port A, column address CA0A is associated with bit line pair BL0A and BL0Ab, and column address CA1A is associated with bit line pair BL1A and BL1Ab. For port B, column address CA0B is associated with bit line pair BL0B and BL0Bb, and column address CA1B is associated with bit line pair BL1B and BL1Bb. For a write, R/W A buffer 76 and R/W B buffer 78 receive the data to be written from global data lines GDLA and GDLB, respectively. R/W A buffer 76 writes the received data onto data line pair DLA and DLAb. R/W B buffer 78 writes the data onto data line pair DLB and DLBb. Selected columns couple the data on the data lines to their bit lines. For example, if bit lines BL0A and BL0Ab are to be written for port A, then transistors 52 and 54 are made conductive by column address signal CA0A being asserted at a logic high. Similarly, if bit lines BL1B and BL1Bb are to be written for port B, column address signal CA1B is asserted and transistors 72 and 74 are conductive to provide data onto the selected bit line pair of BL1B and BL1Bb.

In the case of a read or write where row addresses match and the column addresses do not match, MATCH R is a logic high so that MATCH Rb is a logic low forcing AND gates 82 and 86 to provide a deasserted output at a logic low. Thus even if column address signal CA1b is a logic high, the transistors 72 and 74 are non-conductive but then AND gate 84 provides a logic high output due to MATCH R being a logic high and MATCH Cb being a logic high. MATCH Cb, the complement of MATCH C, is a logic high to indicate that a column match has not occurred. With the output of AND gate 84 at a logic high, transistors 68 and 70 couple bit line pair BL1A and BL1Ab, which are port A bit lines, to data lines DLB and DLBb, which are port B data lines. Thus the bit cell being read or written on port B is read or written by the port B R/W B buffer 78 through port A bit lines, bit line pair BL1A and BL1b. With MATCH R being a logic high, the selected port B row decoder is disabled. Thus for example, if row decoders 30 and 34 of FIG. 1 are both selected then row match detector asserts MATCH R which is received by port B row decoder 34 disabling the port B decoder. With the port B row decoders disabled, then no word lines of port B are enabled with the result that the memory cells along the selected row are coupled to port A bit lines only so that the memory cells along the selected row are subjected to the capacitance of only the port A bit line pair and not the port B bit line pair. This has the effect though of the port B data being written or read not being present on the port B bit lines. Thus, the port B data is accessed through pass transistors that are connected to the port B data lines and the port A bit line pair line pair of the column selected by the port B address. Port A operates normally in that the bit line pair of the column selected by the port A address is coupled to the port A data lines, data lines DLA and DLAb.

For the case where both the column addresses for ports A and B and the row addresses for ports A and B are the same, both port A and port B are addressing the same memory cell. For both a read and a write, the access to the port B bit lines is blocked. The only access to the memory cells is through the port A data lines and port A bit lines. A write to either port A or Port B is accomplished through write circuitry 104 to GDLA and read/write circuit 76 through data line pair DLA, DLAb and bit line pair BL0A, BL0Ab or BL1A, Bl1Ab to the selected memory cell. R/W B buffer 78 is not used in case of both ports addressing the same memory cell. Port A operation for R/W A buffer 76, the row decoders, the bit lines, and the data lines does not change based on the row or column addresses being the same or different. In all of these cases, port A accesses the memory cells through the port A data lines, bit lines, and word lines. With or without either row or column match, one port may read or write independently of the other port reading or writing. Each condition depending on a row or column match or lack of match has been described above. In a given memory access a selected memory cell will read or written, but not both, through the bit lines of only one port so no conflicts arise causing a logic fault or a wait state arise. However, the well known potential of write coupling to read bit lines to the detriment of read data must be dealt with by using design techniques known in the art.

Read/Write Circuit 100 of FIG. 3 responds in different ways depending on MATCH C, MATCH R, and depending if either port A or port B is writing For the cases where either the column address or row addresses are different or both are different, port A reads from or writes through to the global data line GDLA to R/W A circuit 76 and port B reads from or writes to R/W circuit 78 through global data line GDLB. For a read on port A, read circuitry A 102 receives the data on global data line GDLA, provides the needed buffering and timing, and provides an output RDA as the output of port A. Similarly for port B, read circuitry B 106 responds to the data provided on global data line GDLA by providing an output RDB for port B. In the case of the column addresses being different but the row addresses being the same, the data is coupled from the port A bit line pair that is in the column selected by the port B column address to the port B data line pair. Thus R/W B buffer 78 provides the data for port B to global data line GDLB in the same manner as for the cases when the row addresses are different. Similar for a write, data is received as write data WDA by write circuitry A 104 and write data WDB by write circuitry B 108. This data is then provided to global data lines GDLA and GDLB buffered and timed as needed by write circuitry A 104 and write circuitry B 108, respectively.

In another case both row and column address match and MATCH R and MATCH C are asserted to a logic high indicating that both ports are addressing the same bit cell. In the case of a write, only one port may be writing to a common memory cell. Both ports attempting to write with both MATCH R and a MATCH C asserted high is a logic fault and no write occurs. Additionally, the WRITE CONFLICT signal is asserted as notice of an illegal write attempt. In the case where both the row addresses and the column addresses match, all reading and writing is done for both ports is done though global data line GDLA from and to R/W A circuit 76 of FIG. 2 Write for either port A or port B is done through Port a Write Circuitry A 104 to global Data line GDLA. Write data WDB for port B is always received by both Write circuitry A and Write Circuitry B, when present, but is output by only one of the two write circuitries depending on whether the row and column addresses both match.

While Write Circuitry A 104 normally writes write data WDA to global data line GDLA, for the case where both the row and column addresses are the same Write Circuitry A 104 writes write data WDB when port B is writing. In this case Write Circuitry B 108 is inactive. When there is a row address match and a column address match, write data from either port is written to the reading port read output register in the place of the read data from the global data lines. For example when port B is writing, write data WDB is written to the Read circuitry A 102 output register in the place of the read data from the global data lines so it can be outputted as read data RDA For a read with a row address match and a column address match, data is received on only global data line GDLA and is read by both read circuitry A 102 and read circuitry B 106. Because the access for port A and port B is for the same memory cell, the data needs to only come from one global data line. Read circuitry 102 and 106 provide the data as read signals RDA and RDB, respectively, timed and buffered as needed. Global data line GDLB remains inactive during this read. The read is only made on the selected memory cell on the port A bit line pair. In this case, it is not necessary to couple the bit line pair to the port B data line pair because the data is the same for port A and port B. Thus, only the selected bit line pair of Port A is coupled to only one data line pair DLA, DLAb, thereby avoiding having the capacitance of two bit line or two data lines being coupled to the memory cell. This is particularly important during a read and is important in keeping the read times the same regardless of what combination of column and row addresses is provided. Another benefit is minimizing power consumed by switching a minimized data path Thus it is shown that a technique for accessing a multiple port memory can achieve avoiding adding capacitance that would normally occur when two ports are accessing along the same row. Accessing along the same row can easily result in multiple bit lines being coupled to the same memory cell. This adds capacitance which can slow down reading especially.

In one embodiment, memory 10 described above in reference to FIGS. 1-4 is a synchronous multiple port memory which supports simultaneous read and write with no wait states. In this manner, memory 10 is capable of processing a received access request at any of its ports within one clock cycle of its clock. Therefore, memory 10 is capable of providing an output at any of its ports on every cycle. For example, in the case of memory 10 being a dual port memory having ports A and B, for a series of simultaneous read access to A and B, each of ports A and B will provide read data in response to each read access within only a one clock cycle latency. However, it may be necessary to interface memory 10 with other logical circuits which operate at different operating frequencies. For example, each port of memory 10 (such as port A and port B) may need to interface with a logical circuit operating in accordance with a different clock. Therefore, as will be described below in reference to FIGS. 5 and 6, synchronization circuitry is used to allow each port to interface with different clock domains.

Figure 5:
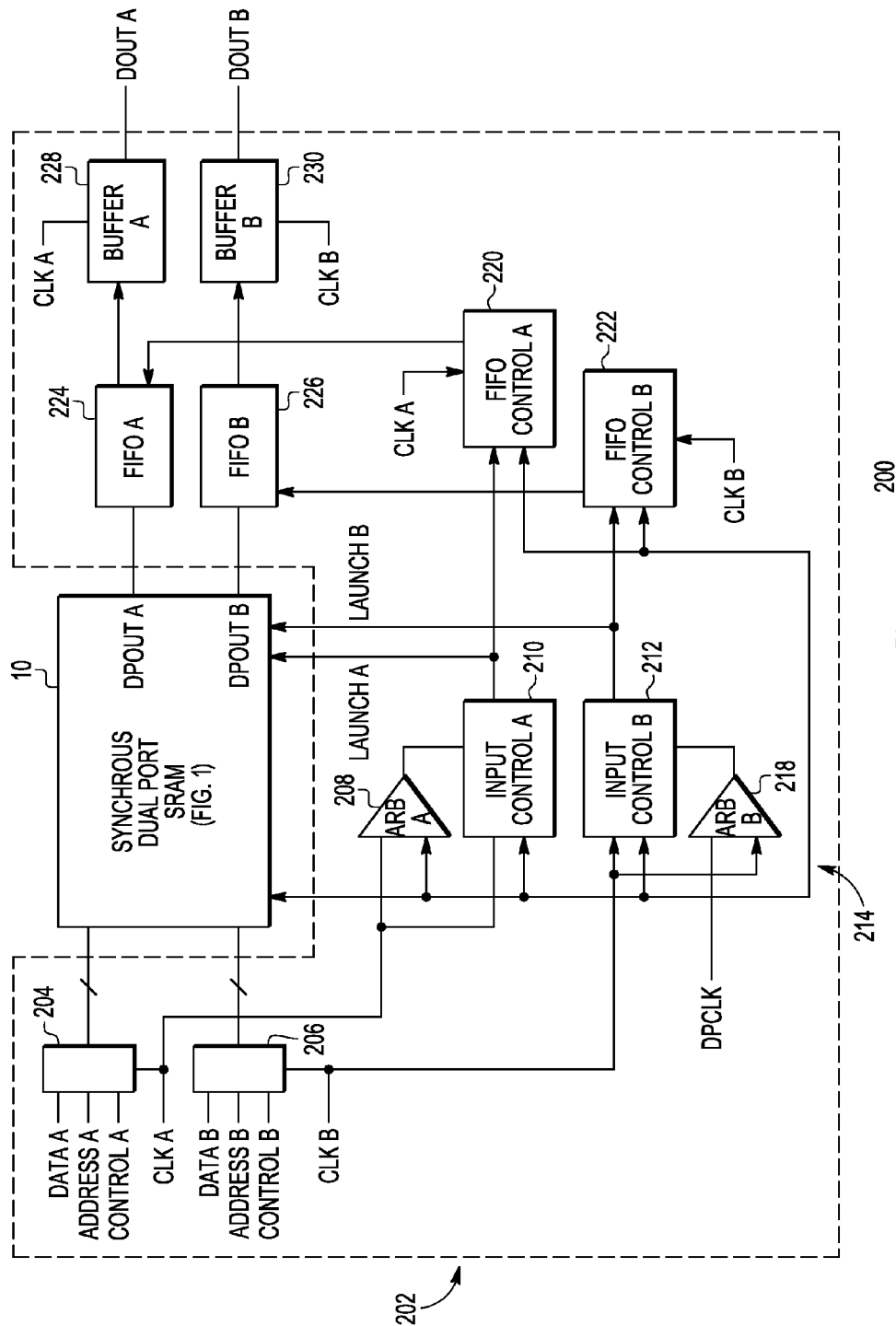
FIG. 5 is a block diagram of a memory system having the memory of FIG. 1 and synchronization circuitry, in accordance with an embodiment of the disclosure.

FIG. 5 illustrates a memory system 200 which includes synchronous multiple port memory 10 (illustrated above in FIG. 1) and synchronization circuitry 202 coupled to memory 10. Although memory 10 may include any number of ports, the examples of FIGS. 5 and 6 will also assume a dual port memory in which memory 10 has a first port, port A, and a second port, port B. Also, the clock which is provided to memory 10 for operation of memory 10 will be referred to as DPCLK. That is, ports A and B of memory 10 are synchronous with DPCLK. Therefore, an access request received by memory 10 will be processed in accordance with DPCLK in which the access request is processed within one clock cycle of DPCLK. In the case of a read access, the read data will be provided as DPOUTA for port A and DPOUTB for port B. Note that these may correspond to RDA and RDB described in reference to FIGS. 1 and 3 above.

Synchronization circuitry 202 includes an input register A 204, an input register B 206, an arbiter (ARB) A 208, an arbiter (ARB) B 218, an input control A 210, an input control B 212, first-in first-out (FIFO) storage circuitry A 224 (referred to as FIFO A 224), a first-in first-out (FIFO) storage circuitry B 226 (referred to as FIFO B 226), a FIFO control A 220, a FIFO control B 222, a buffer A 228, and a buffer B 230. Input register A 204 interfaces with logic circuitry operating in accordance with a clock signal, CLKA, and therefore each of DATA A, ADDRESS A, and CONTROL A for each memory access request provided to port A of memory 10 is received by input register A 204 in accordance with CLKA (synchronized to a predetermined edge of CLKA). Input register B 206 interfaces with logic circuitry operating in accordance with a clock signal, CLKB, and therefore each of DATA B, ADDRESS B, and CONTROL B provided for a memory access request to port B of memory 10 is received by input register B 206 in accordance with CLKB (synchronized to a predetermined edge of CLKB). Similarly, FIFO A 224 provides read data in response to a read access by way of buffer A as DOUTA synchronized with CLKA, and FIFO B provides read data in response to a read access by way of buffer B as DOUTB synchronized with CLKB. However, the access request itself to memory 10 is processed by memory 10 in accordance with its own clock, DPCLK. In the embodiments described herein, DPCLK has to be at least as fast as each clock with which synchronization circuitry 202 interfaces. For example, DPCLK has to be at least as fast as CLKA and at least as fast as CLKB. That is, the operating frequency of DPCLK is greater than or equal to the operating frequency of CLKA and greater than or equal to the operating frequency of CLKB. However, note that DPCLK may either be in or out of phase with each of CLKA and CLKB. Each of CLKA and CLKB may therefore be asynchronous with respect to DPCLK or each other. In this manner, memory system 200 is capable of processing an access request received at either port A or port B of synchronization circuitry 202 within 2 clock cycles of the corresponding clock signal. For example, for read requests provided to input register A 204, read data is provided as DOUTA within 2 clock cycles of CLKA, and read requests provided to input registers B 206, read data is provided as DOUTB within 2 clock cycles of CL KB. Note that since DPCLK is at least as fast as either CLKA or CLKB, within either 2 cycles of CLKA or 2 cycles of CLKB, it is guaranteed that memory 10 will have time to process the access request (which, as described above, is done by memory 10 within one clock cycle of DPCLK). Note that in the examples described herein of FIGS. 5 and 6, it is assumed that signals are synchronized to the rising edges of the clock signals DPCLK, CLKA, or CLKB. However, in alternate embodiments, activities may be synchronized to falling edges rather than rising edges of the clocks.

Still referring to FIG. 5, input register A 204 is coupled to a first input of memory 10 corresponding to port A to provide appropriate information to the appropriate locations of memory 10. For example, input register A 204 provides ADDRESS A to port A row address 20, row match detector 24, port A column address 26, and column match detector 45. Input register A 204 also provides DATA A (such as in the case of write access requests) as WDA to R/W circuitry 100. CONTROL A may also be provided to appropriate locations of memory 10 (in which CONTROL A may includes any number of control signals, such as a R/W signal) to provide information about the current access request. Note that input register A 204 may include one or more registers. Similarly, input register B 206 is coupled to a second input of memory 10 corresponding to port B to provide appropriate information to the appropriate locations of memory 10. For example, input register B 206 provides ADDRESS B to port B row address 22, row match detector 24, port A column address 28, and column match detector 45. Input register B 206 also provides DATA B (such as in the case of write access requests) as WDB to R/W circuitry 100. CONTROL B may also be provided to appropriate locations of memory 10 (in which CONTROL B may includes any number of control signals, such as a R/W signal) to provide information about the current access request. Note that input register B 206 may include one or more registers. However, since input registers 204 and 206 operate on different clocks than memory 10, additional control needs to be provided in order for memory 10 to appropriately receive information from input registers 204 and 206. Therefore, in one embodiment, launch controller 214 is used to determine when to launch an access request by memory 10 in response to information received at input register 204 or 206.

Launch controller 214 provides signals to memory 10, such as LAUNCH A for port A and LAUNCH B for port B, to determine, in response to a rising edge of DPCLK, whether or not to accept (and process) an access request from input register 204 or 206, respectively, and thus provide the signals received at input register 204 or 206 to the appropriate locations of memory 10. For example, referring to port A, launch controller 214 causes an access to be launched and thus processed by port A of memory 10 for a valid address (ADDRESS A) provided by input register A 204 in response to a rising edge of DPCLK unless an immediately preceding rising edge of DPCLK has occurred more recently than a most recent occurrence of a rising edge of CLKA. That is, an access is launched and processed by port A of memory 10 in response to a current rising edge of DPCLK if the immediately preceding rising edge of CLKA is after the immediately preceding rising edge of DPCLK, but is blocked if the immediately preceding rising edge of CLKA is prior to the immediately preceding rising edge of DPCLK. Similarly, referring to port B, launch controller 214 causes an access to be launched and thus processed by port B of memory 10 for a valid address (ADDRESS B) provided by input register B 206 in response to a rising edge of DPCLK unless an immediately preceding rising edge of DPCLK has occurred more recently than a most recent occurrence of a rising edge of CLK B. That is, an access is launched and processed by port B of memory 10 in response to a current rising edge of DPCLK if the immediately preceding rising edge of CLKB is after the immediately preceding edge of DPCLK, but is blocked if the immediately preceding rising edge of CLKB is prior to the immediately preceding rising edge of DPCLK.

In one embodiment, launch controller 214 includes ARB A 208, input control A 210, ARB B 218, and input control B 212. ARB A 208 compares CLKA with DPCLK such that, upon a rising edge of DPCLK, ARB A 208 determines whether a most recent rising edge of CLKA occurred more recently than the current rising edge of DPCLK and provides its output to input control A 210. Input control A 210, based on the determination by ARB A 208, provides LAUNCH A to memory 10. In response to each rising edge of DPCLK, LAUNCH A is asserted by input control A 210 only if a most recent rising edge of CLKA occurred more recently than the rising edge of DPCLK within the previous cycle of DPCLK. Assertion of LAUNCH A results in processing of an access request from input register 204 by port A of memory 10. Therefore, in response to a rising edge of DPCLK, LAUNCH A is not asserted if an immediately preceding rising edge of DPCLK has occurred more recently than a most recent rising edge of CLK A. Similarly, ARB B 218 compares CLK B with DPCLK such that, upon a rising edge of DPCLK, ARB B 218 determines whether a most recent rising edge of CLKB occurred more recently than the current rising edge of DPCLK and provides its output to input control B 212. Input control B 212, based on the determination by ARB B 218, provides LAUNCH B to memory 10. In response to each rising edge of DPCLK, LAUNCH B is asserted by input control B 212 only if a most recent rising edge of CLKB occurred more recently than the rising edge of DPCLK within the previous cycle of DPCLK. Assertion of LAUNCH B results in processing of an access request from input register 206 by port B of memory 10. Therefore, in response to a rising edge of DPCLK, LAUNCH B is not asserted if an immediately preceding rising edge of DPCLK has occurred more recently than a most recent rising edge of CLK B. Note that, in one embodiment, each of ARB A 208 and ARB B 218 may be implemented as dynamic comparators. Operation of launch controller 214 will be described in more detail in reference to the timing diagram of FIG. 6 below.

Still referring to FIG. 5, once an access is launched in response to LAUNCH A or LAUNCH B by memory 10, memory 10 processes the access within one clock cycle of DPCLK. In the case of a read access, read data will be available at DPOUTA and DPOUTB at the next rising edge of DPCLK. Note that if LAUNCH A or LAUNCH B is not asserted at the rising edge of DPCLK, the corresponding port of memory 10 will not process the request present at the corresponding input register. FIFO A 224 and FIFO B 226 are coupled to DPOUTA and DPPOUT B, respectively. FIFO A 224 is controlled by FIFO control A 220 and FIFO B 226 is controlled by FIFO control B 222. FIFO controls 220 and 222 control when an input (the data at DPOUTA or DPOUTB) is pushed into FIFO A 224 or FIFO B 226, respectively, and when an output is popped from FIFO A 224 or FIFO B 226, respectively, into buffer A 228 or buffer B 230, respectively. Note that FIFO control A 220 and FIFO control B 222 may be referred to, separately or collectively, as an input/output controller. In the illustrated embodiment, each FIFO is a two stage FIFO capable of storing two data elements. A push places a data element into the FIFO, and a pop removes the data element of the two data elements that was first pushed into the FIFO. As will be described in more detail below, in response to read accesses, read data is provided as DPOUTA or DPOUTB. The read data at DPOUTA is pushed into FIFO A 224 synchronized to DPCLK while the read data in FIFO A 224 is popped from FIFO A 224 to buffer A 228 synchronized to CLKA. Similarly, the read data at DPOUTB is pushed into FIFO B 226 synchronized to DPCLK while the read data in FIFO B 226 is popped from FIFO B 226 to buffer B 230 synchronized to CLKB. Note that in the illustrated embodiment, a two stage FIFO is sufficient since a read access can be processed in a single DPCLK cycle. In this manner, no more than two clock cycles of CLKA or CLKB is needed to ensure completion of one DPCLK cycle. Therefore, the read data needs to be held, at most, for two clock cycles of CLKA or CLKB to ensure that it is available on the next rising edge of CLKA or CLKB. As will be seen in the example of FIG. 6, with a read access request received at input register A with respect to a rising edge of CLKA, read data will be output as DOUTA from buffer A 228 only 2 clock cycles of CLKA later, and with a read access request received at input register B with respect to a rising edge of CLKB, read data will be output as DOUTB from buffer B 230 only 2 clock cycles of CLKB later.

Figure 6:
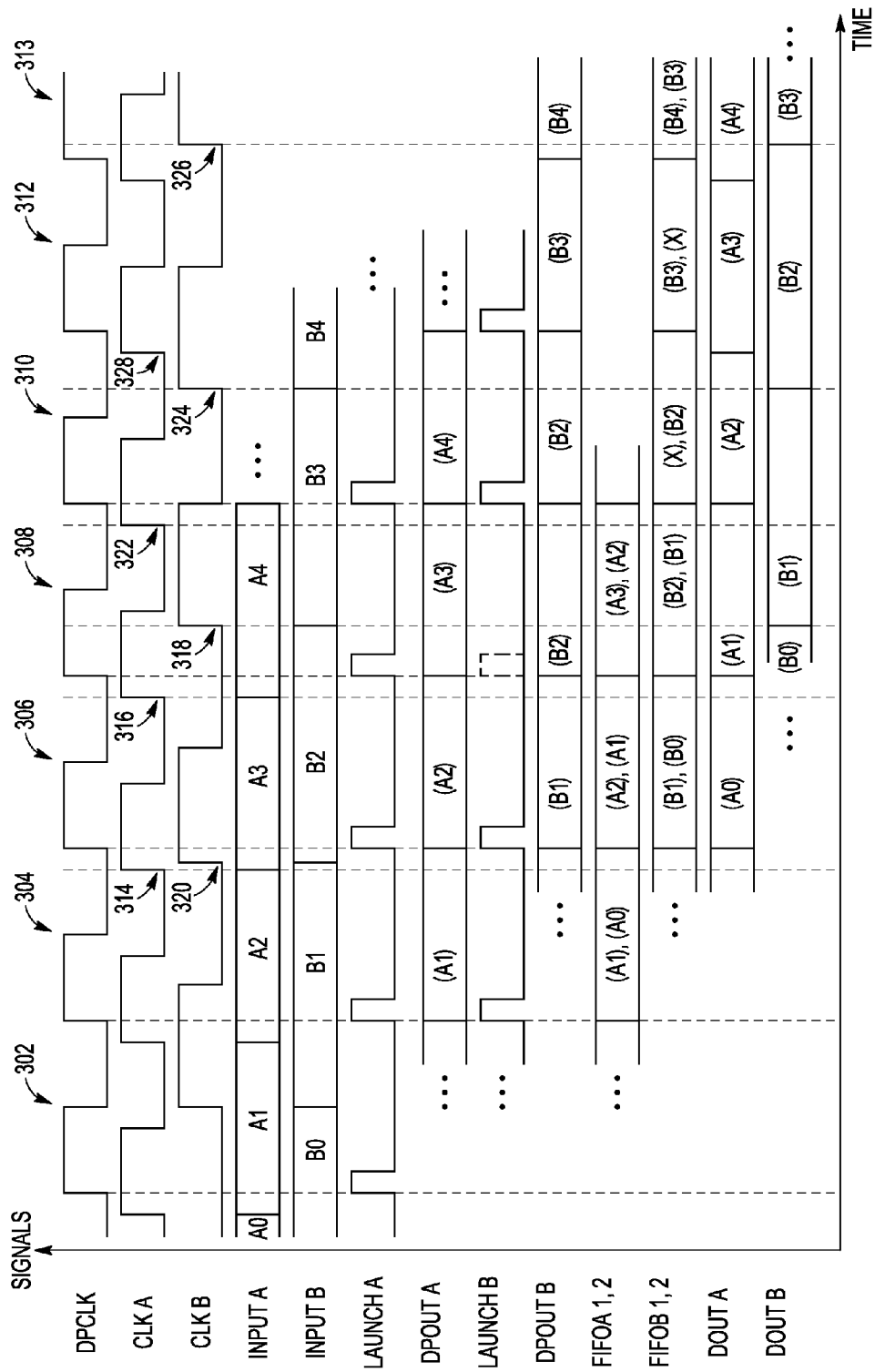
FIG. 6. is a timing diagram of various signals of the memory system of FIG. 5 in accordance with an example operation of the memory system of FIG. 1.

FIG. 6 illustrates an example of various signals within memory system 10 during an example series of read accesses. In the example of FIG. 6, CLKB is slower than CLKA and out of phase with both CLKA and DPCLK, and CLKA, while the same speed as DPCLK, is out of phase with DPCLK. In this example, it is assumed that a series of 5 read access requests is received at input register A 204, one at each rising edge of CLKA. The addresses for these read accesses are denoted as A0, A1, A2, A3, and A4, in which each of these addresses is received sequentially as ADDRESS A to input register A 204. It is also assumed that a series of 5 read access requests is received at input register B 206, one at each rising edge of CLKB. The addresses for these read accesses are denoted as B0, B1, B2, B3, and B4, in which each of these addresses is received sequentially as ADDRESS B to input register B 206. Note that once a read access request is received at input register A 204 or input register B 206 at a rising edge of CLKA or CLKB, the read data will be available as DOUTA or DOUTB, respectively, within 2 clock cycles of CLKA or CLKB, respectively. In FIG. 6, each illustrated cycle of DPCLK is sequentially labeled as cycle 302, 304, 306, 308, 310, and 312. Each clock cycle begins with a rising edge of DPCLK and ends with an immediately following rising edge of DPCLK.

At the rising edge of clock cycle 302, address A1 is present in input register A and address B0 is present in input register B. With respect to address A1, ARB A 208 determines if a rising edge of CLKA occurred prior to the rising edge of cycle 302 of DPCLK (and more recently than a prior rising edge of DPCLK occurring prior to cycle 302). Since a rising edge of CLKA did occur prior to the rising edge of cycle 302 (and without an intervening rising edge of DPCLK between this prior rising edge of CLKA and the rising edge of DPCLK of cycle 302), LAUNCH A is asserted. In response to assertion of LAUNCH A, address A1 at input register 204 is launched to memory 10 to be processed by memory 10. Therefore, in one cycle of DPCLK from the assertion of LAUNCH A (i.e. at the rising edge of the next clock cycle 304 of DPCLK), the read data stored at address A1, which is denoted as (A1), is present at DPOUTA. Also, with the rising edge of cycle 304 of DPCLK, FIFO control A 220 causes a push of (A1) into FIFO A 224. It is assumed, in the illustrated embodiment, that in some previous cycle of DPCLK, the read data at address A0, which is denoted as (A0), was also pushed by FIFO control A 220 into FIFO A. Therefore, at the rising edge of cycle 304 of DPCLK, note that the contents of the 2 data elements of FIFO A 224 is (A1) and (A0). Note that in the example of FIG. 6, the contents of either FIFO A 224 or FIFO B 226 is denoted as two read data elements separated by a comma. The second read data element of the two read data elements (e.g. (A0) in cycle 304) corresponds to the oldest of the two elements (the one which was pushed in first), and the first read data element of the two read data elements (e.g. (A1) in cycle 304) corresponds to the newest of the two elements (the one which was most recently pushed in).

Still referring to cycle 304 of DPCLK, at the rising edge of DPCLK, note that A2 is now present at input A 204 and B1 at input B 206. With respect to address A1, ARB A 208 determines if a rising edge of CLKA occurred prior to the rising edge of clock cycle 304 of DPCLK (and more recently than rising edge of cycle 302). Since a rising edge of CLKA did occur prior to the rising edge of cycle 304, LAUNCH A is again asserted. Similarly, with respect to address B1, ARB B 218 determines if a rising edge of CLKB occurred prior to the rising edge of clock cycle 304 of DPCLK (and more recently than rising edge of cycle 302). Since a rising edge of CLKB did occur prior the rising edge of cycle 304, LAUNCH B is asserted. In the current example, each of LAUNCH A and LAUNCH B, when asserted, result in a pulse that is provided to memory 10 to allow the appropriate addresses to reach the appropriate circuits within memory 10. For example, the LAUNCH A and LAUNCH B can be used to appropriately gate the inputs from input registers 204 and 206 to circuitry of memory 10 such as row match detector 24, column match detector 45, row address units 20 and 22, column address units 26 and 28, and R/W circuitry 100. In this manner, assertion of LAUNCH A and LAUNCH B determines when memory 10 can begin processing of the request present at input registers A and B, respectively.

In response to assertion of LAUNCH A and LAUNCH B in cycle 304 of DPCLK, the read data stored at A2, denoted as (A2), is provided at DPOUTA at the rising edge of the next clock cycle 306 of DPCLK, and the read data stored at B1, denoted as (B1), is provided at DPOUTB at the rising edge of clock cycle 306. Therefore, each of the requests at input registers A and B, upon being launched to memory 10, are processed within one clock cycle of DPCLK. Upon each rising edge of CLKA and CLKB, a data element is popped from FIFO A 224 and FIFO B 226, respectively. Therefore, at rising edge 314 of CLKA, FIFO control A 220 causes a pop from FIFO A 224 such that (A0), which is the first data element of FIFO A that was pushed into FIFO A, is provided to buffer A 228 and is thus provided as DOUTA. Therefore, note that while data elements in response to read requests are pushed into FIFO A 224 in accordance with DPCLK (e.g. upon rising edges of DPCLK), data elements are popped from FIFO A 224 in accordance with CLKA (e.g. upon rising edges of CLKA). With (A0) having been popped from FIFO A 224, FIFO A 224 includes only one element at the moment. However, with the subsequent rising edge of cycle 306 of DPCLK, FIFO control A 220 causes a push of (A2) into FIFO A 224, and FIFO control B 222 causes a push of (B1) into FIFO B 226. Therefore, FIFO A 224 now stores (A2), (A1), and FIFO B 226 now stores (B1), (B0). Note that, for simplicity, the contents of FIFO A 224 and FIFO B 226 are being illustrated with respect to the rising edges of DPCLK and the changes to FIFO A and FIFO B caused by the pushes in accordance to CLKA and CLKB, respectively, are not being illustrated. Instead, the pushes are reflect by the appropriate data elements being provided as DOUTA or DOUTB (in accordance with CLKA or CLKB, respectively).

Referring to the rising edge of cycle 306 of DPCLK, inputs A3 and B2 are available at input registers A and B, respectively. ARB A 218 determines if a rising edge of CLKA occurred prior to the rising edge of cycle 306 of DPCLK (and more recently than rising edge of cycle 304), and ARB B 218 determines if a rising edge of CLKB occurred prior to the rising edge of cycle 306 of DPCLK (and more recently than rising edge of cycle 304). Since a rising edge of CLKA did occur prior to the rising edge of cycle 306 of DPCLK, LAUNCH A is asserted in response thereto at the rising edge of cycle 306, and since a rising edge of CLKB did occur prior to the rising edge of cycle 306 of DPCLK, LAUNCH B is asserted in response thereto at the rising edge of cycle 306. Therefore, in cycle 306, read requests corresponding to A3 and B2 are launched in memory 10, and at the rising edge of the next clock cycle 308 of DPCLK, the read data for each, denoted as (A3) and (B2), respectively, is available at DPOUTA and DPOUTB. At rising edge 316 of CLKA, FIFO control A 220 causes a pop from FIFO A 224 such that (A1) is provided to buffer A 228 and is thus provided as DOUTA. Also, at rising edge 318 of CLKB, FIFO control B 222 causes a pop from FIFO B 226 such that (B1) is provided to buffer B 230 and is thus provided as DOUTB. Also, upon the rising edge of clock cycle 308, FIFO control A 220 causes a push of (A3) into FIFO A 224, and FIFO control B 222 causes a push of (B2) into FIFO B 226. Therefore, FIFO A 224 now stores (A3), (A2), and FIFO B 226 now stores (B2), (B1).

Referring to the rising edge of cycle 308 of DPCLK, input A4 is available at input register A, and input B2 is still available at input register B. ARB A 218 determines if a rising edge of CLKA occurred prior to the rising edge of cycle 308 of DPCLK (and more recently that rising edge of cycle 306), and ARB B 218 determines if a rising edge of CLKB occurred prior to the rising edge of cycle 308 of DPCLK. Since a rising edge of CLKA did occur prior to the rising edge of cycle 308 of DPCLK, LAUNCH A is asserted in response thereto at the rising edge of cycle 308. Therefore, in cycle 310, a read request corresponding to A4 is launched for processing by memory 10. However, note that with respect to CLKB, a rising edge of CLKB did not occur prior to the rising edge of cycle 308 of DPCLK more recently that the rising edge of cycle 306. That is, a most recent preceding rising edge 320 of CLKB prior to the rising edge of cycle 308 of DPCLK occurred prior to the rising edge of cycle 306. As discussed above, in response to a rising edge of DPCLK, LAUNCH B is not asserted if an immediately preceding rising edge of DPCLK has occurred more recently than a most recent rising edge of CLK B. Since, in response to the rising edge of cycle 308 of DPCLK, the immediately preceding rising edge of cycle 306 of DPCLK did occur more recently that the most recent rising edge 320 of CLK B, LAUNCH B is not asserted at the rising edge of cycle 308 of DPCLK. Therefore, in cycle 310, a read request corresponding to B2 is not launched for processing by memory 10. In this manner, processing of the read request corresponding to B2 is not unnecessarily launched twice in a row. That is, the read request corresponding to B2 was already previously processed in cycle 306 and the read data, (B2), was already pushed to FIFO B 226 at the rising edge of cycle 308. Therefore, at the rising edge of cycle 310, even though FIFO control B 222 causes a push onto FIFO B 226, the data pushed in is a "don't care", which is denoted as (X). Some value will be present at DPOUTB at the rising edge of cycle 310, which may be the same as the previous value, (B2), but it does not matter what the value is or what gets pushed into FIFO B 226 because, as will be seen below, this "don't care" value will not be provided as an output read data at DOUTB of system 200.

At a subsequent rising edge 322 of CLKA, FIFO control A 220 causes a pop from FIFO A 224 such that (A2) is provided to buffer A 228 and is thus provided as DOUTA. Note that a subsequent rising edge 324 of CLKB does not yet occur. That is, another rising edge of DPCLK (of cycle 310) occurs prior to rising edge 324. Therefore, in cycle 308 of DPCLK, no push into FIFO B is performed.

Referring to the rising edge of cycle 310 of DPCLK, input B3 is now available at input register B 206 (note that the inputs of input register A 204 are no longer being illustrated at this point in the example of FIG. 6). In this case, since the rising edge 318 of CLK B did occur prior to the rising edge of cycle 310 of DPCLK (and more recently than the rising edge of cycle 308), LAUNCH B is asserted at the rising edge of cycle 310 in response thereto and a read request corresponding to B3 is launched for processing by memory 10. Therefore, at the rising edge of cycle 312 of DPLCK, the read data, (B3), is available at DPOUTB. Also, upon subsequent rising edge 324 of CLKB, FIFO control B 222 causes a pop from FIFO B 226 such that (B2) is provided to buffer B 230 and is thus provided as DOUTB. Then, at the rising edge of cycle 312 of DPCLK, FIFO B control 22 causes a push of (B3) into FIFO B 226. At the rising edge of cycle 312 of DPCLK, FIFO B 226 therefore contains (B3), (X).

Still referring to the rising edge of cycle 312 of DPCLK, input B4 is now available at input register B 206. In this case, since the rising edge 324 of CLK B did occur prior to the rising edge of cycle 312 of DPCLK (and more recently than the rising edge of cycle 310), LAUNCH B is asserted at the rising edge of cycle 312 in response thereto and a read request corresponding to B4 is launched for processing by memory 10. Therefore, at the rising edge of cycle 313 of DPLCK, the read data, (B4), is available at DPOUTB.

Note that the rising edge of cycle 313 of DPCLK occurs prior to the immediately subsequent rising edge 326 of CLKB. Therefore, at the rising edge of clock 313, (B4) is available at DPOUTB and FIFO control B 222 causes a push of (B4) into FIFO B 226. However, since FIFO B 226 is only a two-element FIFO, the don't care value (X) "falls" out of the FIFO due to the pushing of B4. This is appropriate, since the value which fell out due to the overflow of the two-element FIFO is a don't care anyway. In this manner, at the next rising edge 326 of CLKB, in which FIFO control B 222 causes a pop from FIFO B 226, the value that is popped is (B3), which is the appropriate read data to be provided with respect to the input sequence of read requests to system 200.

Therefore, at each rising edge of CLKB (edges 318, 324, and 326), the read data (B1), (B2), (B3) corresponding to the input read requests corresponding of port B to B1, B2, B3 are appropriately provided. Furthermore, at each rising edge of CLKA (edges 314, 316, 322, and 328), the read data (A0), (A1), (A2), (A3) corresponding to the input read requests of port A corresponding to A0, A1, A2, 13 are appropriately provided. And by only launching the processing of a request by memory 10 upon a rising edge of DPCLK when a rising edge of CLKA or CLKB occurs prior the rising edge of DPCLK and more recently than an immediately preceding rising edge of DPCLK, the requests get processed correctly in accordance with DPCLK and output correctly in accordance with CLKA or CLKB. For example, note that, in FIG. 6, each time a read request of system 200 is provided in accordance with its own clock (e.g. CLKA or CLKB) is launched from a port for processing by memory 10, the read data is available within two clock cycles of that clock (CLKA or CLKB) at the output of system 200. For example, the read request for A3, which is provided at rising edge 314 of CLKA, is provided at DOUTA at rising edge 322 of CLKA, which is only two clock cycles later of CLKA. Similarly, the read request for B2, which is provided at rising edge 320 of CLKB, is provided at DOUTB at rising edge 324 of CLL B, which is only two clock cycles later of CLKB. Even though CLKB is much slower than DPCLK, by not asserting LAUNCH B at the rising edge of cycle 308 of DPCLK, the resulting processing of FIFO B 226 allowed for (B2) to be provided to clock cycles later of CLKB from the time the corresponding read request was received and (B3) to be provided two clock cycles later of CLKB from the time the corresponding read request was received.

Therefore, by now it has been appreciated how each port of system 200 is capable of receiving access request and providing outputs of the access request in accordance with clocks that are different than the clock of the multiple port memory itself. So long as the clock with which each port operates of system 200 (e.g. CLKA and CLKB) are the same speed or slower than the memory clock (e.g. DPCLK), the outputs at each port of system 200 (e.g. DOUTA and DOUTB) can be provided at two clock cycles of the clock with which the port operates.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the disclosure is described herein with reference to specific embodiments, various modifications and changes can be made without departing from the scope of the present invention as set forth in the claims below. For example, although the disclosure was described in the context of two ports, it may be applied to memory architectures in which there are more than two ports. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a memory system which includes a multi-port memory having a first port and a second port asynchronous with a master clock having a first edge and a second edge; first input registers synchronous with a first clock having a first edge and a second edge in which the first input registers output a valid address responsive to the first edge of the first clock, wherein the first clock may be asynchronous respective to the master clock; and second input registers synchronous with a second clock having a first edge and a second edge in which the second input registers output a valid address responsive to the first edge of the second clock, wherein the second clock may be asynchronous with respect to the master clock. The multi-port memory launches an access for the valid address provided by the first input registers in response to the first edge of the master clock unless an immediately preceding first edge of the master clock has occurred more recently than the most recent occurrence of the first edge of the first clock; and the multi-port memory launches an access for the valid address provided by the second input registers in response to the first edge of the master clock unless an immediately preceding first edge of the master clock has occurred more recently than the most recent occurrence of the first edge of the second clock. The memory system includes a first FIFO coupled to the multi-port memory for the first port, wherein the first FIFO is pushed in synchronization with the master clock and pops in synchronization with the first clock; and a second FIFO coupled to the multi-port memory for the second port, wherein the second FIFO is pushed in synchronization with the master clock and pops in synchronization with the second clock. Item 2 includes the memory system of item 1, wherein data corresponding to the valid address of the first input registers pops in the first FIFO on the second occurrence of the first edge of the first clock after the launch of the access at the valid address of the first registers. Item 3 includes the memory system of item 1, wherein the data corresponding to the valid address of the first input registers is pushed in the first FIFO on the first occurrence of the first edge of the master clock after the launch of the access at the valid address of the first input registers. Item 4 includes the memory system of item 1, wherein a launch controller determines if a launch is to be performed in response to a first edge of the master clock. Item 5 includes the memory system of item 4, wherein the launch controller receives the master clock, the first clock, and the second clock. Item 6 includes the memory system of item 5, wherein the launch controller includes: a first input controller for receiving the first clock and an output of a comparator that compares the first clock and the master clock and provides a first launch signal to the multi-port memory; and a second input controller for receiving the second clock and an output of a comparator that compares the second clock and the master clock and provides a second launch signal to the multi-port memory. Item 7 includes the memory system of item 6, wherein an output controller is coupled to the first FIFO and the second FIFO, and wherein the first and second FIFOs pop and are pushed by the output controller. Item 8 includes the memory system of item 7, wherein the output controller includes: a first controller that receives the first launch signal and the first clock signal and provides an output to the first FIFO; and a second controller that receives the second launch signal and the second clock signal and provides an output to the second FIFO. Item 9 includes the memory system of item 8, wherein the multi-port memory performs simultaneous accesses on the first and second ports without wait states. Item 10 includes the memory system of item 1, wherein the first edge is a rising edge for the first clock, the second clock, and the master clock.

Item 11 includes a method of operating a multi-port memory using a master clock, a first clock for a first port, and a second clock for a second port, wherein the first and second clocks may be asynchronous relative to the master clock. The method includes providing a first valid address for the first port; providing a second valid address for the second port; performing an access of the multi-port memory at the first valid address through the first port based on a current first edge of the master clock, an immediately preceding first edge of the master clock, and an immediately preceding first edge of the first clock, wherein the access is responsive to the current first edge of the master clock if the immediately preceding first edge of the first clock is after the immediately preceding first edge of the master clock and the access is blocked if the immediately preceding first edge of the first clock is prior to the immediately preceding first edge of the master clock; and performing an access of the multi-port memory at the second valid address through the second port based on the current first edge of the master clock, the immediately preceding first edge of the master clock, and an immediately preceding first edge of the second clock, wherein the access is responsive to the current first edge of the master clock if the immediately preceding first edge of the second clock is after the immediately preceding first edge of the master clock and the access is blocked if the immediately preceding first edge of the second clock is prior to the immediately preceding first edge of the master clock. Item 12 includes the method of item 11 in which, in the case of the access being a read of data in the step of performing the access of the multi-port memory at the first valid address, the output of the multi-port memory for port A is through a first FIFO in which the data is pushed in the first FIFO on the first occurrence of the first edge of the master clock after the launch of the access at the first valid address. Item 13 includes the method of item 12, wherein the step of performing the access of the multi-port memory at the first valid address is further characterized by the output of the multi-port memory for port A being through the first FIFO in which data pops on the second occurrence of the first edge of the first clock after the launch of the access at the first valid address. Item 14 includes the method of item 13, wherein the performing the access of the multi-port memory at the first valid address is further characterized as being controlled by an input/output controller. Item 15 includes the method of item 11, wherein the providing the first valid address for the first port is further characterized by being identified as valid at a first edge of the first clock. Item 16 includes the method of item 14, wherein the providing the first valid address for the first port is provided by first input registers that are clocked by the first clock. Item 17 includes the method of item 15, wherein the step of performing the access of the multi-port memory at the first valid address is further characterized by the multi-port memory simultaneously accessing the first and second ports without wait states.

Item 18 includes a memory system including a multi-port memory having a first port and a second port which can simultaneously perform accesses on the first port and the second port without wait states responsive to a master clock; first input registers providing a first address to the first port on a first edge of a first clock; second input registers providing a second address to the first port on a first edge of a second clock; and an access controller, coupled to the master clock, the first clock, the second clock, and the multi-port memory to control the multi-port memory to: launch an access for the first address provided by the first input registers in response to the first edge of the master clock unless an immediately preceding first edge of the master clock has occurred more recently than the most recent occurrence of the first edge of the first clock; and launch an access for the second address provided by the second input registers in response to the first edge of the master clock unless an immediately preceding first edge of the master clock has occurred more recently than the most recent occurrence of the first edge of the second clock. Item 19 includes the memory system of item 18, and further includes an input/output controller coupled to the first clock, the second clock, and the master clock and having a first output and a second output; a first FIFO coupled to the multi-port memory for the first port and to the first output of the input/output controller, wherein the first FIFO is pushed in synchronization with the master clock and pops in synchronization with the first clock; and a second FIFO coupled to the multi-port memory for the second port and to the second output of the input/output controller, wherein the second FIFO is pushed in synchronization with the master clock and pops in synchronization with the second clock. Item 20 includes the memory system of item 19, wherein data corresponding to the first address of the first input registers pops in the first FIFO on the second occurrence of the first edge of the first clock after the launch of the access at the first address of the first input registers.

Item 21 includes a multiport asynchronous memory, including a first port of the multiport asynchronous memory controlled by a first clock having a first and second edge; a second port of the multiport asynchronous memory controlled by a second clock having a first and second edge which are asynchronous to the first and second edges of the first clock; a memory input for receiving a first input address and a first control signal for the first port which are registered for a first read access by a registering first edge of the first clock; a first output for providing output data for the first port and resulting from the first read access, where the first output data for the first access is provided in response to the second occurring first edge of the first clock after the registering first edge of the first clock without wait states; a second memory input for receiving a second input address and a second control signal for the second port which are registered for a second read access that is concurrent with the first access by a registering first edge of the second clock; and a second output for providing second output data for the second port resulting from the second access, where the first output data for the second access is provided in response to the second occurring first edge of the second clock after the registering first edge of the second clock, wherein the multiport asynchronous memory has no wait states for the first port or the second port.

What is claimed is:

1. A memory system, comprising:
a multi-port memory having a first port and a second port asynchronous with a master clock having a first edge and a second edge;
first input registers synchronous with a first clock having a first edge and a second edge in which the first input registers output a valid address responsive to the first edge of the first clock, wherein the first clock may be asynchronous respective to the master clock;
second input registers synchronous with a second clock having a first edge and a second edge in which the second input registers output a valid address responsive to the first edge of the second clock, wherein the second clock may be asynchronous with respect to the master clock;
wherein:
the multi-port memory launches an access for the valid address provided by the first input registers in response to the first edge of the master clock unless an immediately preceding first edge of the master clock has occurred more recently than the most recent occurrence of the first edge of the first clock; and
the multi-port memory launches an access for the valid address provided by the second input registers in response to the first edge of the master clock unless an immediately preceding first edge of the master clock has occurred more recently than the most recent occurrence of the first edge of the second clock;
a first FIFO coupled to the multi-port memory for the first port, wherein the first FIFO is pushed in synchronization with the master clock and pops in synchronization with the first clock; and
a second FIFO coupled to the multi-port memory for the second port, wherein the second FIFO is pushed in synchronization with the master clock and pops in synchronization with the second clock.

2. The memory system of claim 1, wherein data corresponding to the valid address of the first input registers pops in the first FIFO on the second occurrence of the first edge of the first clock after the launch of the access at the valid address of the first registers.

3. The memory system of claim 1, wherein the data corresponding to the valid address of the first input registers is pushed in the first FIFO on the first occurrence of the first edge of the master clock after the launch of the access at the valid address of the first input registers.

4. The memory system of claim 1, wherein a launch controller determines if a launch is to be performed in response to a first edge of the master clock.

5. The memory system of claim 4, wherein the launch controller receives the master clock, the first clock, and the second clock.

6. The memory system of claim 5, wherein the launch controller comprises:
a first input controller for receiving the first clock and an output of a comparator that compares the first clock and the master clock and provides a first launch signal to the multi-port memory; and
a second input controller for receiving the second clock and an output of a comparator that compares the second clock and the master clock and provides a second launch signal to the multi-port memory.

7. The memory system of claim 6, wherein an output controller is coupled to the first FIFO and the second FIFO, wherein the first and second FIFOs pop and are pushed by the output controller.

8. The memory system of claim 7, wherein the output controller comprises:
a first controller that receives the first launch signal and the first clock signal and provides an output to the first FIFO; and
a second controller that receives the second launch signal and the second clock signal and provides an output to the second FIFO.

9. The memory system of claim 8, wherein the multi-port memory performs simultaneous accesses on the first and second ports without wait states.

10. The memory system of claim 1, wherein the first edge is a rising edge for the first clock, the second clock, and the master clock.

11. A method of operating a multi-port memory using a master clock, a first clock for a first port, and a second clock for a second port, wherein the first and second clocks may be asynchronous relative to the master clock, comprising:
providing a first valid address for the first port;
providing a second valid address for the second port;
performing an access of the multi-port memory at the first valid address through the first port based on a current first edge of the master clock, an immediately preceding first edge of the master clock, and an immediately preceding first edge of the first clock, wherein the access is responsive to the current first edge of the master clock if the immediately preceding first edge of the first clock is after the immediately preceding first edge of the master clock and the access is blocked if the immediately preceding first edge of the first clock is prior to the immediately preceding first edge of the master clock; and
performing an access of the multi-port memory at the second valid address through the second port based on the current first edge of the master clock, the immediately preceding first edge of the master clock, and an immediately preceding first edge of the second clock, wherein the access is responsive to the current first edge of the master clock if the immediately preceding first edge of the second clock is after the immediately preceding first edge of the master clock and the access is blocked if the immediately preceding first edge of the second clock is prior to the immediately preceding first edge of the master clock.

12. The method of claim 11, in the case of the access being a read of data in the step of performing the access of the multi-port memory at the first valid address, the output of the multi-port memory for port A is through a first FIFO in which the data is pushed in the first FIFO on the first occurrence of the first edge of the master clock after the launch of the access at the first valid address.

13. The method of claim 12, wherein the step of performing the access of the multi-port memory at the first valid address is further characterized by the output of the multi-port memory for port A being through the first FIFO in which data pops on the second occurrence of the first edge of the first clock after the launch of the access at the first valid address.

14. The method of claim 13, wherein the performing the access of the multi-port memory at the first valid address is further characterized as being controlled by an input/output controller.

15. The method of claim 11, wherein the providing the first valid address for the first port is further characterized by being identified as valid at a first edge of the first clock.

16. The method of claim 14, wherein the providing the first valid address for the first port is provided by first input registers that are clocked by the first clock.

17. The method of claim 15, wherein the step of performing the access of the multi-port memory at the first valid address is further characterized by the multi-port memory simultaneously accessing the first and second ports without wait states.

18. A memory system, comprising:
a multi-port memory having a first port and a second port which can simultaneously perform accesses on the first port and the second port without wait states responsive to a master clock;
first input registers providing a first address to the first port on a first edge of a first clock;
second input registers providing a second address to the first port on a first edge of a second clock; and
an access controller, coupled to the master clock, the first clock, the second clock, and the multi-port memory to control the multi-port memory to:
launch an access for the first address provided by the first input registers in response to the first edge of the master clock unless an immediately preceding first edge of the master clock has occurred more recently than the most recent occurrence of the first edge of the first clock; and
launch an access for the second address provided by the second input registers in response to the first edge of the master clock unless an immediately preceding first edge of the master clock has occurred more recently than the most recent occurrence of the first edge of the second clock.

19. The memory system of claim 18, further comprising:
an input/output controller coupled to the first clock, the second clock, and the master clock and having a first output and a second output;
a first FIFO coupled to the multi-port memory for the first port and to the first output of the input/output controller, wherein the first FIFO is pushed in synchronization with the master clock and pops in synchronization with the first clock; and
a second FIFO coupled to the multi-port memory for the second port and to the second output of the input/output controller, wherein the second FIFO is pushed in synchronization with the master clock and pops in synchronization with the second clock.

20. The memory system of claim 19, wherein data corresponding to the first address of the first input registers pops in the first FIFO on the second occurrence of the first edge of the first clock after the launch of the access at the first address of the first input registers.

21. A multiport asynchronous memory, comprising:
a first port of the multiport asynchronous memory controlled by a first clock having a first and second edge;
a second port of the multiport asynchronous memory controlled by a second clock having a first and second edge which are asynchronous to the first and second edges of the first clock;
a memory input for receiving a first input address and a first control signal for the first port which are registered for a first read access by a registering first edge of the first clock;
a first output for providing output data for the first port and resulting from the first read access, where the first output data for the first access is provided in response to the second occurring first edge of the first clock after the registering first edge of the first clock without wait states;
a second memory input for receiving a second input address and a second control signal for the second port which are registered for a second read access that is concurrent with the first access by a registering first edge of the second clock; and
a second output for providing second output data for the second port resulting from the second access, where the first output data for the second access is provided in response to the second occurring first edge of the second clock after the registering first edge of the second clock,
wherein the multiport asynchronous memory has no wait states for the first port or the second port.

* * * * *